(12) United States Patent
Kawamoto

(10) Patent No.: US 7,368,825 B2
(45) Date of Patent: May 6, 2008

(54) POWER SEMICONDUCTOR DEVICE

(75) Inventor: Atsunobu Kawamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/019,741

(22) Filed: Dec. 23, 2004

(65) Prior Publication Data

US 2006/0138635 A1 Jun. 29, 2006

(30) Foreign Application Priority Data

May 17, 2004 (JP) .............................. 2004-145819

(51) Int. Cl.
*H01L 23/52* (2006.01)
*H01L 23/48* (2006.01)
*H01L 29/40* (2006.01)

(52) U.S. Cl. ................. 257/781; 257/E23.02; 257/690; 257/758; 257/296; 361/766; 361/313; 174/252

(58) Field of Classification Search .......... 257/E23.02, 257/E29.345, 758, 690, 700, 503, 781, 756, 257/301, 306, 355, 296; 361/766, 313; 174/252, 174/260
See application file for complete search history.

(56) References Cited

U.S. PATENT DOCUMENTS 5,394,013 A * 2/1995 Oku et al. .................. 257/786
6,147,857 A * 11/2000 Worley et al. ............ 361/301.2
6,284,617 B1 * 9/2001 Erdeljac et al. .............. 438/381
6,448,641 B2 * 9/2002 Ker et al. .................... 257/700
6,455,378 B1 * 9/2002 Inagawa et al. ............. 438/270
6,476,459 B2    11/2002 Lee
6,509,593 B2 * 1/2003 Inoue et al. ................. 257/295
6,576,526 B2 * 6/2003 Kai et al. .................... 438/393
6,576,922 B1 * 6/2003 Ma et al. ....................... 257/48
6,700,147 B1 * 3/2004 Saigoh ........................ 257/295
2004/0113190 A1 * 6/2004 Oh et al. ..................... 257/296

FOREIGN PATENT DOCUMENTS

| JP | 63-120446 | 5/1988 |
|----|-----------|--------|
| JP | 63-184358 | 7/1988 |
| JP | 02-304963 | 12/1990 |
| JP | 6-112406  | 4/1994 |
| JP | 2000-58765 | 2/2000 |

* cited by examiner

*Primary Examiner*—Chris C. Chu
(74) *Attorney, Agent, or Firm*—McDermott Will & Emery LLP

(57) ABSTRACT

The present invention is directed to a power semiconductor device in which a control circuit controls a power switching element, comprising: a semiconductor substrate having a front surface and a back surface; a capacitor disposed on the front surface side of the semiconductor substrate and being comprised of a stacked structure of a first conductive layer, an insulation film and a second conductive layer; and a bonding pad which is disposed on the front surface side to the capacitor and to which a bonding wire being connected, wherein the bonding pad are arranged overlapping the capacitor.

16 Claims, 7 Drawing Sheets

Fig. 8A -- PRIOR ART
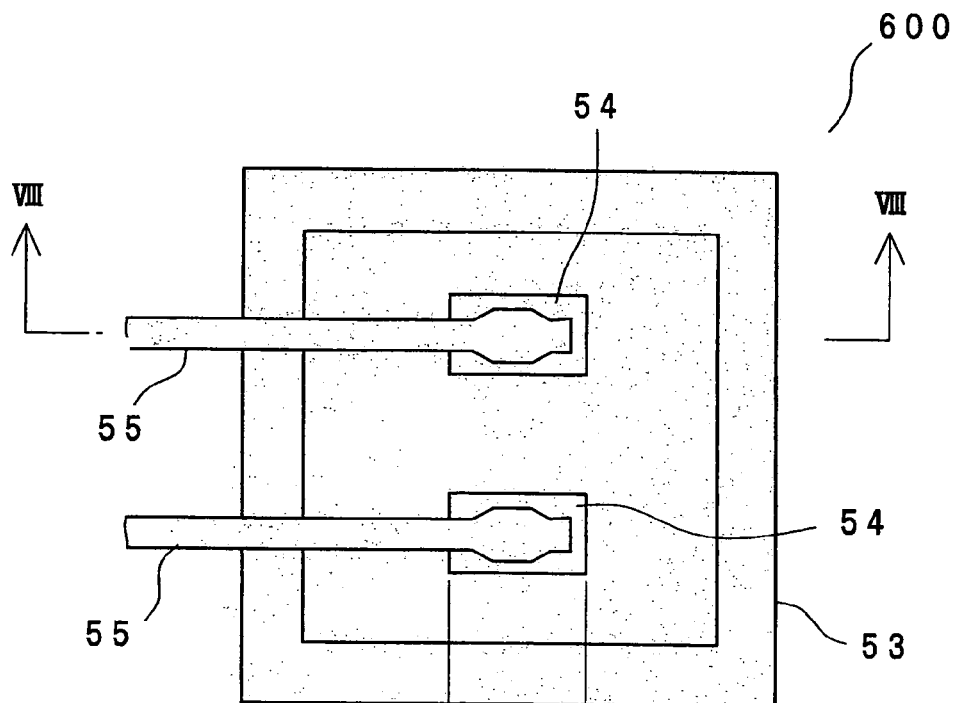
Fig. 8B
(PRIOR ART)
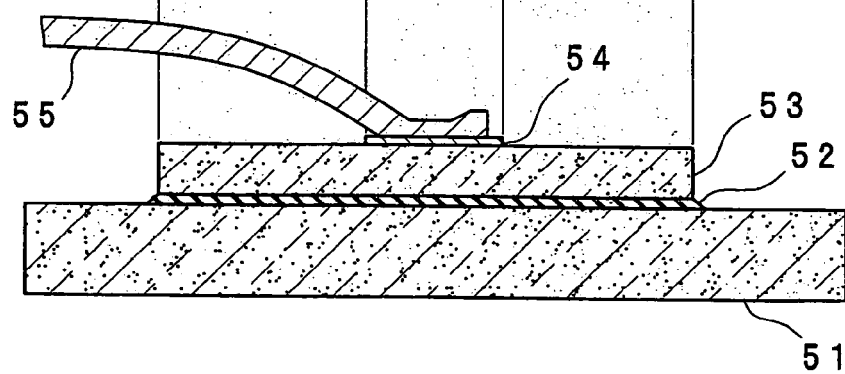

Fig. 9 -- PRIOR ART
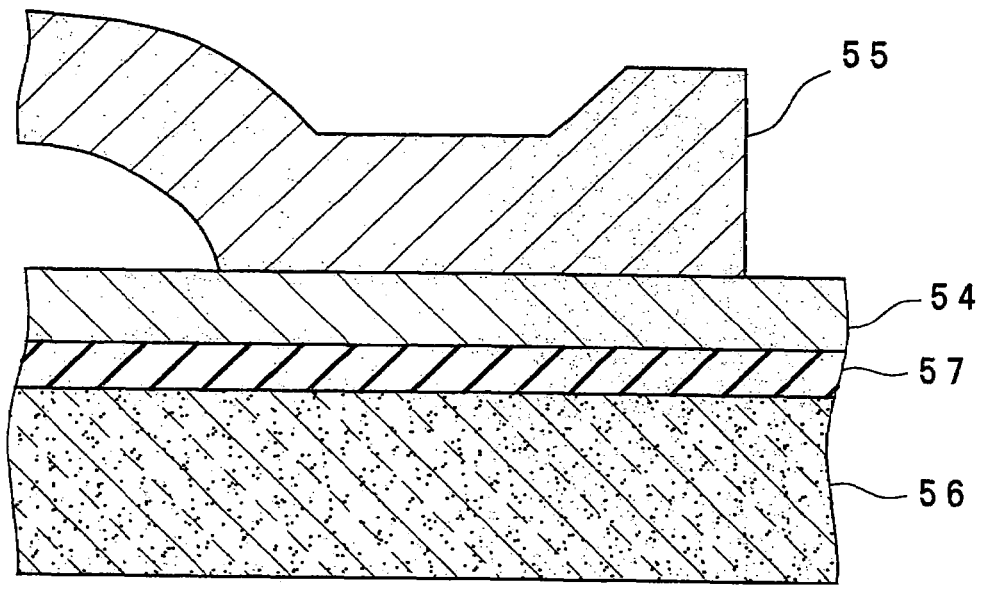

POWER SEMICONDUCTOR DEVICE

CROSS-REFERENCE TO RELATED APPLICATION

The disclosure of Japanese Patent Application No. 2004-145819 filed on May 17, 2004 including specification, drawings and claims is incorporated herein by reference in its entirety

BACKGROUND OF THE INVENTION

1. Field of the Invention

The present invention relates to a power semiconductor device in which a control circuit controls a power switching element, and more particularly, to a power semiconductor device having a capacitor.

2. Description of the Related Art

FIGS. 8A and 8B are a schematic drawing of a conventional power semiconductor device generally denoted at 600. FIG. 8A is a top view of bonding pad portions, and FIG. 8B is a cross sectional view taken along the direction VIII-VIII shown in FIG. 8A. The power semiconductor device 600 includes an insulated gate bipolar transistor (IGBT) and a control circuit (not shown) which controls the same.

As shown in FIGS. 8A and 8B, the power semiconductor device 600 includes a die pad 51 of alumina or the like. A semiconductor chip 53 is fixed on the die pad 51 by a bonding material 52 such as a solder. The semiconductor chip 53 includes the control circuit, the IGBT which is a power switching element, and the like. A bonding pad 54 of aluminum or the like is disposed on the top surface of the semiconductor chip 53 and connected to a bonding wire 55 of aluminum or the like.

FIG. 9 is a cross sectional view expanding the bonding pad 54 and a surrounding area. The semiconductor chip 53 shown in FIG. 8B includes a silicon substrate 56, and on the silicon substrate 56, the bonding pad 54 is disposed via a silicon oxide film 57 and the bonding wire 55 is connected on this (JP, 2000-058765, A).

SUMMARY OF THE INVENTION

However, in the event that the power semiconductor device 600 includes a large-capacity capacitor, the power semiconductor device 600 becomes large-sized partly because the capacity is in proportion to the area size of the capacitor. This pushes up a manufacturing cost and makes it difficult to reduce the size of the power semiconductor device 600.

Noting this, the inventor found through dedicated research and investigation that when a capacitor was fabricated using metal wires and insulation layers belonging to a power semiconductor device, it was possible to arrange a bonding pad and the capacitor over each other and reduce the size of the power semiconductor device, thus completing the present invention.

An object of the present invention is to reduce the size of a power semiconductor device in which a control circuit controls a power switching element.

The present invention is directed to a power semiconductor device in which a control circuit controls a power switching element, comprising: a semiconductor substrate having a front surface and a back surface; a capacitor disposed on the front surface side of the semiconductor substrate and being comprised of a stacked structure of a first conductive layer, an insulation film and a second conductive layer; and a bonding pad which is disposed on the front surface side to the capacitor and to which a bonding wire being connected, wherein the bonding pad are arranged overlapping the capacitor.

According to the present invention, a bonding pad and a capacitor are arranged over each other, and therefore, it is possible to reduce the size of a power semiconductor device which comprises a large-capacity capacitor.

BRIEF DESCRIPTION OF THE DRAWINGS

FIGS. 8A and 8B are a schematic drawing of the conventional power semiconductor device; and FIG. 9 is a cross sectional view of the conventional power semiconductor device.

DETAILED DESCRIPTION OF THE PREFERRED EMBODIMENTS

Embodiment 1

Figure 1:
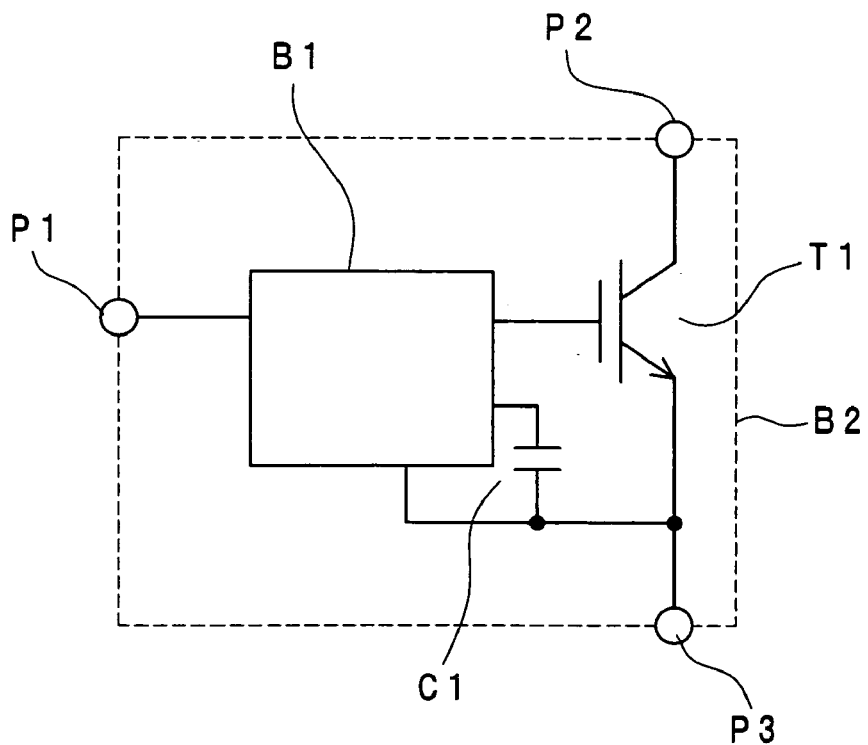
FIG. 1 is a circuit diagram of the power semiconductor device according to the embodiment 1 of the present invention.

FIG. 1 is a circuit diagram of a power semiconductor device B2 according to the embodiment 1 of the present invention. The power semiconductor device B2 includes an insulated gate bipolar transistor (IGBT) T1 which is a power switching element. A control circuit B1 is connected to a control input terminal P1 of the IGBT T1. The IGBT T1 further includes an output terminal P2 and a GND terminal P3. There is a capacitor C1 between the control circuit B1 and the GND terminal P3.

Figure 2:
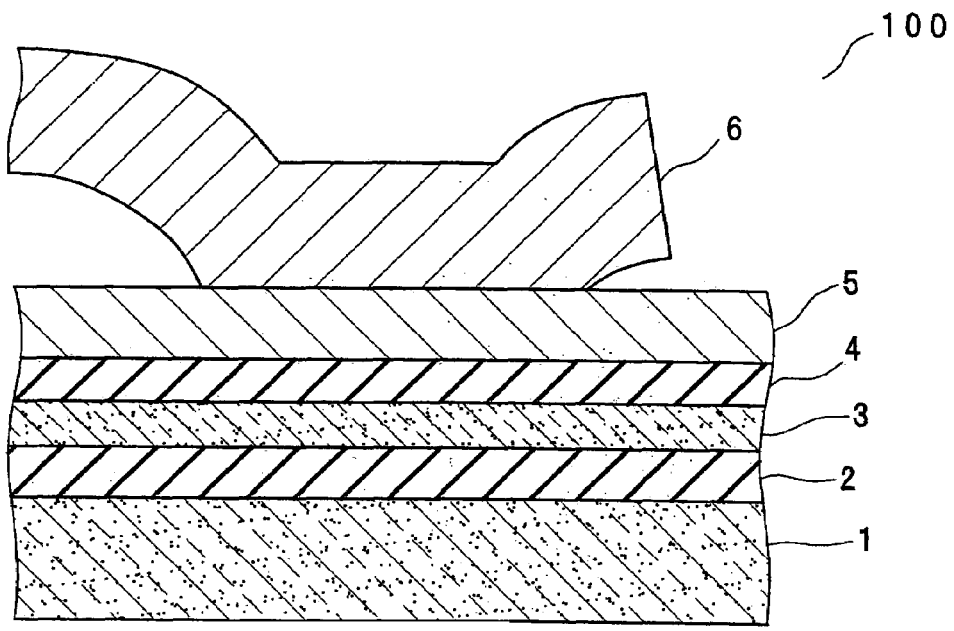
FIG. 2 is a cross sectional view of the power semiconductor device according to the embodiment 1 of the present invention.

FIG. 2 is a cross sectional view of the power semiconductor device according to the embodiment 1 generally denoted at 100, as viewed in the same direction as the direction VIII-VIII of FIG. 8A. The power semiconductor device 100 includes a silicon substrate 1. On the silicon substrate 1, an insulation film 2 of silicon oxide for instance, a polycrystalline silicon layer 3 and an insulation film 4 of silicon oxide for instance are stacked in this order. A metal layer 5 of aluminum for example is disposed on the insulation film 4.

The metal layer 5 also serves as a bonding pad, and a bonding wire 6 of aluminum or the like is connected to the metal layer 5. The bonding wire 6 is used for connection with an external signal, a fix potential (GND) or the like.

As described above, the power semiconductor device 100 includes the IGBT and the control circuit (not shown), the polycrystalline silicon layer 3 is formed at the same time that a wiring layer of the control circuit is formed, and the metal layer 5 is formed at the same time that a metal wiring layer used as the fix potential (GND potential) is formed.

In the power semiconductor device 100, the insulation film 4 and the polycrystalline silicon layer 3 and the metal layer 5 which are on the both sides of the insulation film 4 form a capacitor. The metal layer 5 of this capacitor serves also as a bonding pad for connection with the bonding wire 6. As the bonding pad and the capacitor are thus arranged over each other, the size of the power semiconductor device 100 is reduced.

With the polycrystalline silicon layer 3 connected to a gate of the IGBT, it is possible to increase the gate capacitance of the IGBT and enhance the electrostatic surge resistance. A structure according to an embodiment 3 described later also attains an IGBT having a large electrostatic surge resistance

Embodiment 2

Figure 3:
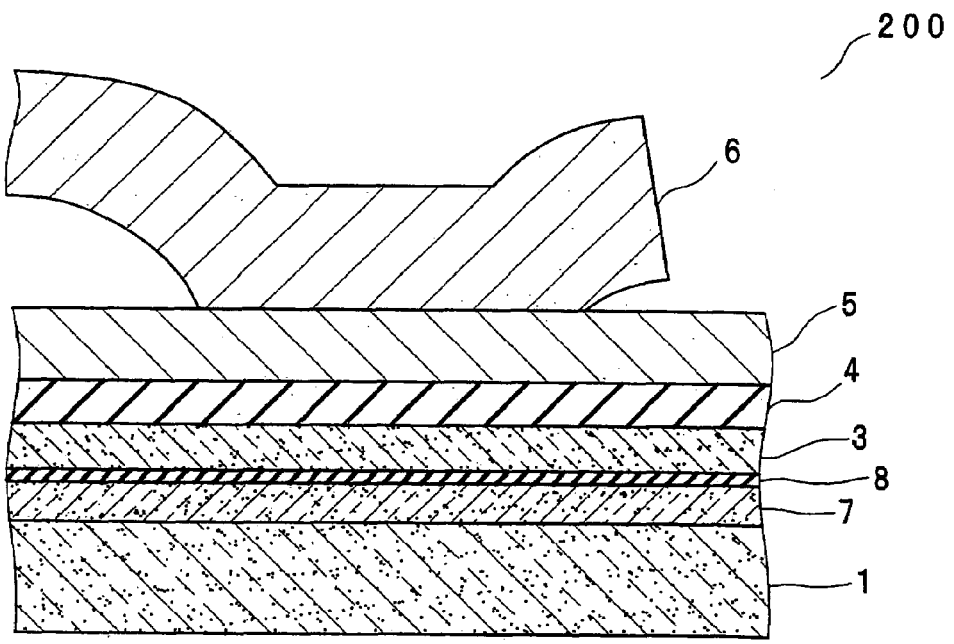
FIG. 3 is a cross sectional view of the power semiconductor device according to the embodiment 2 of the present invention.

FIG. 3 is a cross sectional view of a power semiconductor device according to the embodiment 2 generally denoted at 200, as viewed in the same direction as the direction VIII-VIII of FIG. 8A. In FIG. 3, the same reference symbols as those used in FIG. 2 denote the same or corresponding portions.

The power semiconductor device 200 includes the silicon substrate 1. An impurity implantation layer 7 to which a high-concentration impurity has been implanted is formed on the silicon substrate 1. The impurity implantation layer 7 is used usually as the fix potential (GND). An insulation film 8 of silicon oxide for instance which also serves as a gate oxide film of the IGBT is formed on the impurity implantation layer 7. The polycrystalline silicon layer 3, the insulation film 4 and the metal layer 5 are disposed on the insulation film 8. The metal layer 5 serves also as a bonding pad, and the bonding wire 6 is connected to the metal layer 5.

In the power semiconductor device 200, the insulation film 8 and the impurity implantation layer 7 and the polycrystalline silicon layer 3 which are on the both sides of the insulation film 8 form a capacitor. Since the bonding pad and the capacitor are arranged over each other in this structure, the size of the power semiconductor device 200 is reduced.

Further, as described above, since the insulation film 8 is formed at the same time that the gate oxide film of the IGBT is formed, the film thickness becomes as thin as a few hundreds angstroms and it therefore is possible to increase the capacitance of the capacitor per unit area.

In addition, since the insulation film 4 is formed on the capacitor, it is possible to prevent mechanical destruction of the capacitor while the bonding wire 6 is connected to the metal layer 5.

Embodiment 3

Figure 4:
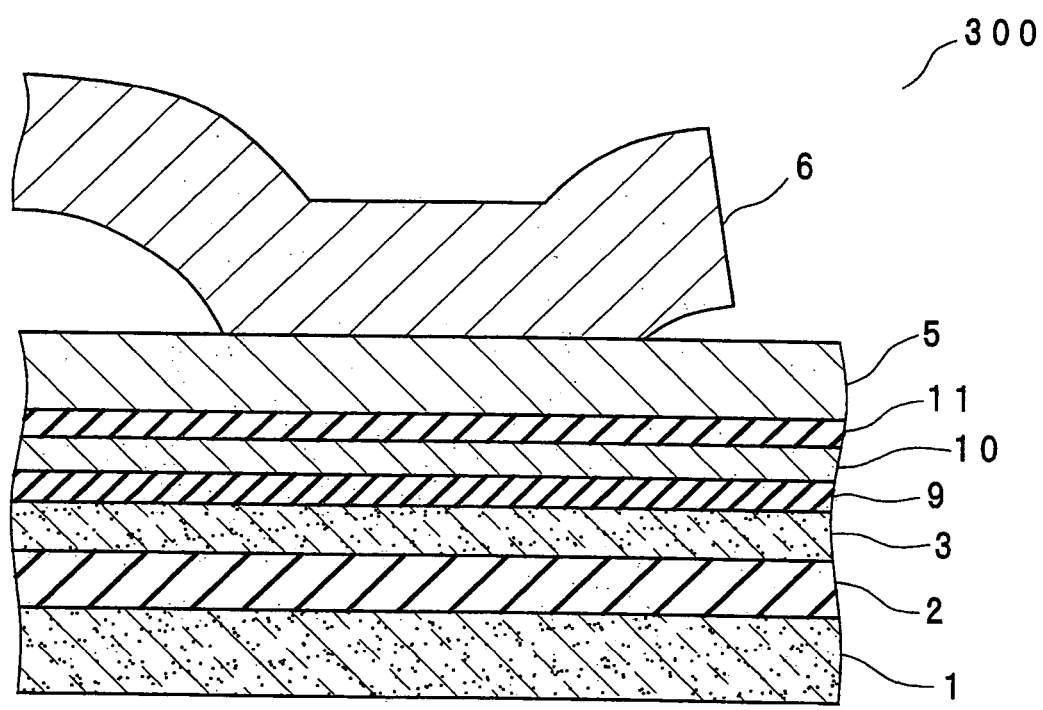
FIG. 4 is a cross sectional view of the power semiconductor device according to the embodiment 3 of the present invention.

FIG. 4 is a cross sectional view of a power semiconductor device according to the embodiment 3 generally denoted at 300, as viewed in the same direction as the direction VIII-VIII of FIG. 8A. In FIG. 4, the same reference symbols as those used in FIG. 2 denote the same or corresponding portions.

As in the power semiconductor device 100, in the power semiconductor device 300, the insulation film 2 and the polycrystalline silicon layer 3 are formed on the silicon substrate 1, and further, an insulation film 9 of silicon oxide, a metal layer 10 of aluminum or the like and an insulation film 11 of silicon oxide or the like are formed on this. The metal layer 5 which serves also as a bonding pad is disposed on the insulation film 11, and the bonding wire 6 is connected on the metal layer 5. The polycrystalline silicon layer 3 and the metal layer 10 are used also as wiring layers of the control circuit or the like.

In the power semiconductor device 300 having this structure, the insulation film 9 and the polycrystalline silicon layer 3 and the metal layer 10 which are on the both sides of the insulation film 9 form a capacitor, while the insulation film 11 and the metal layer 10 and the metal layer 5 which are on the both sides of the insulation film 11 also form a capacitor.

Figure 5:
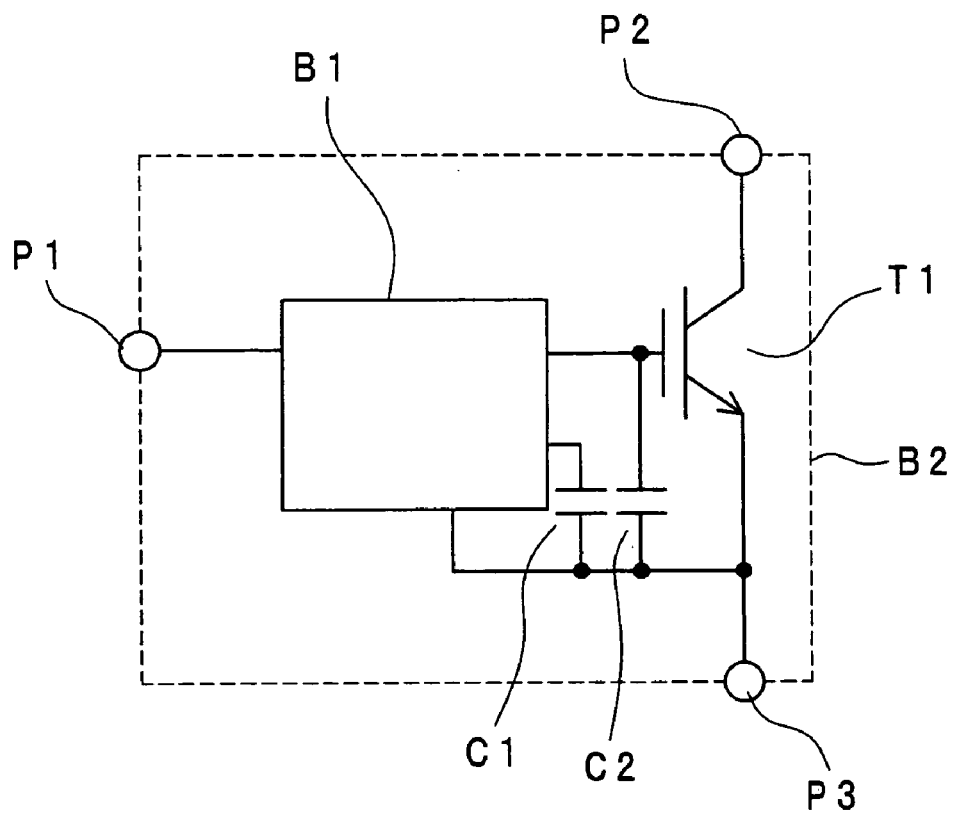
FIG. 5 is a circuit diagram of the power semiconductor device according to the embodiment 3 of the present invention.

FIG. 5 is a circuit diagram of the power semiconductor device 300. In addition to the circuits of the power semiconductor device 100 shown in FIG. 1, a capacitor C2 is connected between a gate terminal and an emitter terminal of the IGBT T1. In this circuitry, the capacitor C2 has a function of increasing the electrostatic surge resistance.

Since the bonding pad and the capacitors are arranged over each other in this structure, the size of the power semiconductor device 300 is reduced.

Parallel connection increases the capacitance of the capacitor per unit area approximately twice, particularly because of the two stacked capacitors in the power semiconductor device 300.

Embodiment 4

Figure 6:
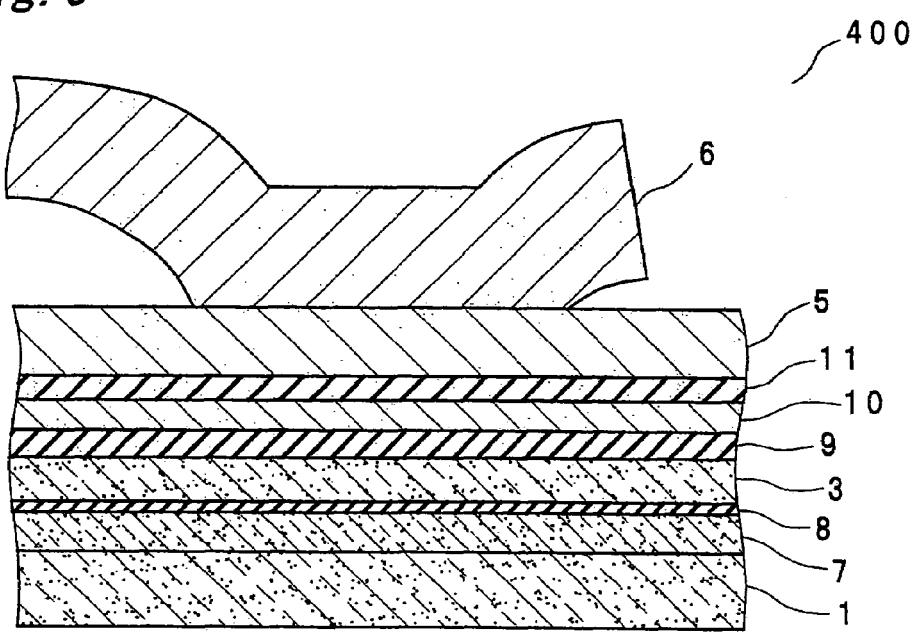
FIG. 6 is a cross sectional view of the power semiconductor device according to the embodiment 4 of the present invention.

FIG. 6 is a cross sectional view of a power semiconductor device according to the embodiment 4 generally denoted at 400, as viewed in the same direction as the direction VIII-VIII of FIG. 8A. In FIG. 6, the same reference symbols as those used in FIG. 2 denote the same or corresponding portions.

As in the power semiconductor device 200, in the power semiconductor device 400, the impurity implantation layer 7 and the insulation film 8 are formed on the silicon substrate 1, and the polycrystalline silicon layer 3 is formed further on this. The insulation film 8 serves also as the gate oxide film of the IGBT, and the insulation film 8 and the impurity implantation layer 7 and the polycrystalline silicon layer 3 which are on the both sides of the insulation film 8 form a capacitor.

The insulation film 9 of silicon oxide or the like, the metal layer 10 of aluminum or the like and the insulation film 11 of silicon oxide or the like are formed on the polycrystalline silicon layer 3. The metal layer 5 which serves also as a bonding pad is disposed on the insulation film 11, and the bonding wire 6 is connected on the metal layer 5. In the power semiconductor device 400, the metal layer 10 is connected to the fix potential (GND).

Since the bonding pad and the capacitor are arranged over each other in this structure, the size of the power semiconductor device 400 is reduced.

Further, the metal layer 10 disposed above the capacitor is connected to the fix potential (GND), it is possible to shield the capacitor against a change of a potential occurring at the surface of the power semiconductor device 400 (i.e., above the metal layer 10) and stabilize the capacitance of the capacitor.

Embodiment 5

Figure 7:
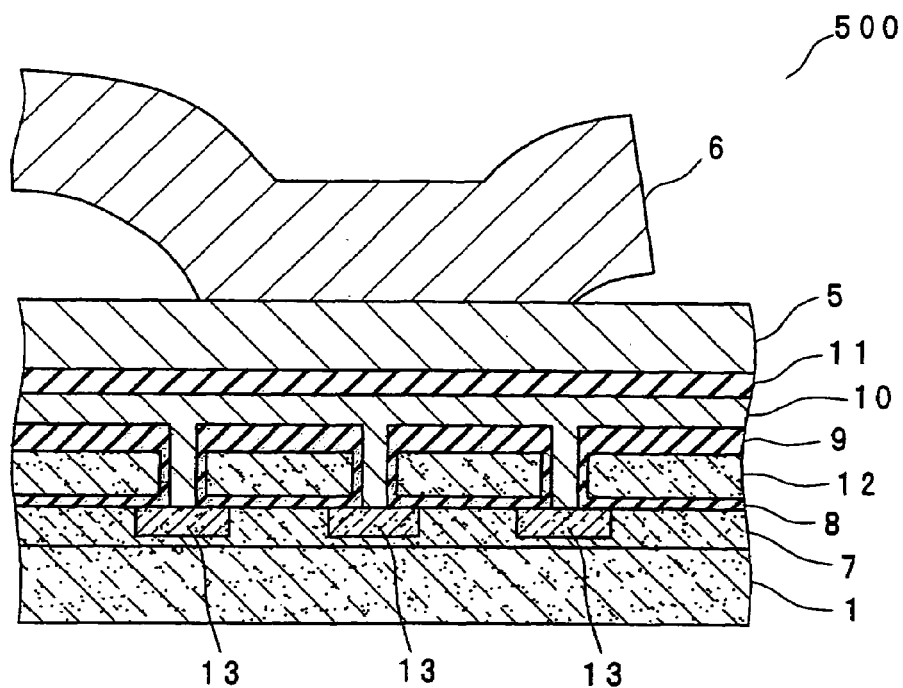
FIG. 7 is a cross sectional view of the power semiconductor device according to the embodiment 5 of the present invention.

FIG. 7 is a cross sectional view of a power semiconductor device according to the embodiment 5 generally denoted at 500, as viewed in the same direction as the direction VIII-VIII of FIG. 8A. In FIG. 7, the same reference symbols as those used in FIG. 2 denote the same or corresponding portions.

In the power semiconductor device 500, the impurity implantation layer 7 and the insulation film 8 are formed on the silicon substrate 1. The insulation film 8 serves also as the gate oxide film of the IGBT. A polycrystalline silicon layer 12 shaped like stripes extending in a direction perpendicular to the plane of FIG. 7 is formed on the insulation film 8. The insulation film 9 or silicon oxide or the like, the metal layer 10 of aluminum or the like and the insulation film 11 of silicon oxide or the like are formed on the polycrystalline silicon layer 12. Further, the impurity implantation layer 7 and the metal layer 10 are connected by an impurity implantation layer 13 to which a high-concentration impurity has been implanted.

The metal layer 5 which serves also as a bonding pad is formed on the insulation film 11, and the bonding wire 6 is connected on the metal layer 5. The insulation film 8 and the polycrystalline silicon layer 12 and the impurity implantation layer 7 which are on the both sides of the insulation film 8 form a capacitor.

Since the bonding pad and the capacitor are arranged over each other in this structure, the size of the power semiconductor device 500 is reduced.

Further, since the impurity implantation layer 7 and the metal layer 10 are connected by the impurity implantation layer 13, the capacitor is shielded against the back surface of the power semiconductor device 500 which seats a collector electrode (not shown). Because of this, even when a voltage of a few hundreds volts is applied upon the collector electrode, it is possible to stabilize the capacitance of the capacitor.

While the foregoing has described the embodiments 1 through 5 in relation to an example that a silicon substrate is used, the embodiments 1 through 5 are applicable to where other semiconductor substrate such as a substrate of GaAs, InP or the like is used.

Further, other than an IGBT, a semiconductor element such as a power FET may be used as the power switching element.

What is claimed is:

1. A power semiconductor device comprising a control circuit for controlling a power switching element, comprising:
    a semiconductor substrate;
    a capacitor disposed on the semiconductor substrate and comprising a first conductive layer, an insulation film and a second conductive layer arranged in that order from the semiconductor substrate; and
    a bonding pad disposed on the second conductive layer of the capacitor and connected to a bonding wire,
    wherein the bonding pad is arranged overlapping the capacitor,
    the first conductive layer is coupled to a terminal of an element selected from the group consisting of the control circuit and the power switching element, and
    the second conductive layer is coupled to the power switching element and a ground terminal.

2. The power semiconductor device according to claim 1, wherein a plurality of such capacitors are stacked on the front surface side of the semiconductor substrate.

3. The power semiconductor device according to claim 1, wherein an insulation film is disposed between the capacitor and the bonding pad.

4. The power semiconductor device according to claim 1, wherein a third conductive layer is disposed between the capacitor and the bonding pad.

5. The power semiconductor device according to claim 4, wherein the third conductive layer is connected a fixed potential.

6. The power semiconductor device according to claim 1, wherein a conductive layer is disposed between the semiconductor substrate and the capacitor.

7. The power semiconductor device according to claim 6, wherein the conductive layer is connected to a fixed potential.

8. The power semiconductor device according to claim 1, wherein the insulation film forming the capacitor is comprised of a gate oxide film of the power switching element which is included in the power semiconductor device.

9. A power semiconductor device comprising a control circuit for controlling a power switching element, comprising:
    a semiconductor substrate;
    a capacitor disposed on the semiconductor substrate and comprising a first conductive layer, an insulation film and a second conductive layer arranged in that order from the semiconductor substrate; and
    a bonding pad disposed on the second conductive layer of the capacitor and connected to a bonding wire,
    wherein the bonding pad is arranged overlapping the capacitor, and
    the first conductive layer is coupled to a control terminal of the power switching element.

10. The power semiconductor device according to claim 9, wherein a plurality of such capacitors are stacked on the front surface side of the semiconductor substrate.

11. The power semiconductor device according to claim 9, wherein an insulation film is disposed between the capacitor and the bonding pad.

12. The power semiconductor device according to claim 9, wherein a third conductive layer is disposed between the capacitor and the bonding pad.

13. The power semiconductor device according to claim 12, wherein the third conductive layer is connected to a fixed potential.

14. The power semiconductor device according to claim 9, wherein a conductive layer is disposed between the semiconductor substrate and the capacitor.

15. The power semiconductor device according to claim 14, wherein the conductive layer is connected to a fixed potential.

16. The power semiconductor device according to claim 9, wherein the insulation film forming the capacitor is comprised of a gate oxide film of the power switching element which is included in the power semiconductor device.

* * * * *